(12) United States Patent
Monestier et al.

(10) Patent No.: US 11,031,579 B2
(45) Date of Patent: Jun. 8, 2021

(54) METHOD OF MANUFACTURING AN OLED DEVICE

(71) Applicant: Lumileds LLC, San Jose, CA (US)

(72) Inventors: Florent Monestier, Aachen (DE); Udo Karbowski, Aachen (DE)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 16/753,707

(22) PCT Filed: Sep. 14, 2018

(86) PCT No.: PCT/EP2018/074914
§ 371 (c)(1),
(2) Date: Apr. 3, 2020

(87) PCT Pub. No.: WO2019/068446
PCT Pub. Date: Apr. 11, 2019

(65) Prior Publication Data
US 2020/0274111 A1    Aug. 27, 2020

(30) Foreign Application Priority Data
Oct. 6, 2017  (EP) ..................... 17195152

(51) Int. Cl.
*H01L 27/32*   (2006.01)
*H01L 51/56*   (2006.01)
*H01L 51/50*   (2006.01)

(52) U.S. Cl.
CPC .......... *H01L 51/56* (2013.01); *H01L 27/3202* (2013.01); *H01L 27/3206* (2013.01);
(Continued)

(58) Field of Classification Search
CPC ....... H01L 27/3225–3227; H01L 27/30; H01L 27/0225; H01L 27/0292;
(Continued)

(56) References Cited

U.S. PATENT DOCUMENTS

2014/0361279 A1* 12/2014 Schicktanz ............. H01L 51/52
257/40
2015/0349036 A1   12/2015 Popp et al.
2017/0263687 A1*  9/2017 Jaeger ................. H01L 27/3225

FOREIGN PATENT DOCUMENTS

DE       102012223159 A1   6/2014

OTHER PUBLICATIONS

Machine Translation of DE102012223159, Jun. 18, 2014, 86 pages.
PCT International Search Report and Written Opinion in PCT/EP2018/074914 dated Nov. 30, 2018, 15 pages.

* cited by examiner

*Primary Examiner* — Matthew C Landau
*Assistant Examiner* — Eric K Ashbahian
(74) *Attorney, Agent, or Firm* — Servilla Whitney LLC (57) ABSTRACT

The invention describes a method of manufacturing an OLED device (1) comprising an OLED (10) and an integrated negative overvoltage protection diode (11), which method comprises at least the steps of: depositing a first OLED electrode (100) and a separate second OLED electrode contact (101C) on a carrier (12), which second OLED electrode contact (101C) incorporates a first overvoltage protection diode electrode (110); depositing an organic material layer stack (14) to define an active region (14OLED) of the OLED (10) and an active region (14OPD) of the overvoltage protection diode (11); depositing a second OLED electrode (101) to extend over the active region (14OLED) of the OLED (10) and the second OLED electrode contact (101C); and depositing a second overvoltage protection diode electrode (111) to extend over the active region (14OPD) of the overvoltage protection diode (11) and the first OLED electrode (100).

14 Claims, 7 Drawing Sheets

(52) U.S. Cl.
CPC ...... *H01L 27/3225* (2013.01); *H01L 51/5012*
(2013.01); *H01L 2251/305* (2013.01)

(58) Field of Classification Search
CPC ... H01L 27/3206–3209; H01L 27/3204; H01L
51/5102; H01L 51/56; B32B 2457/206
See application file for complete search history.

METHOD OF MANUFACTURING AN OLED DEVICE

CROSS-REFERENCE TO RELATED APPLICATIONS

This application is the National Stage entry of PCT/EP2018/074914, filed on Sep. 14, 2018, which claims priority to U.S. Provisional application Ser. No. 17/195,152.8, filed Oct. 6, 2017, the entire disclosures of which are hereby incorporated by reference herein.

FIELD OF THE INVENTION

The invention describes a method of manufacturing an OLED device, and also describes an OLED device with an integrated negative overvoltage protection diode.

BACKGROUND OF THE INVENTION

Organic light-emitting diodes are being more widely used in lighting applications such as OLED panels, for example. An OLED is generally made by depositing layers on a transparent substrate or carrier in a particular order, so that an organic material layer stack is sandwiched between electrodes, one or both of which may be transparent. Depending on the nature of the application in which it is to be used, an OLED device may be built up on a transparent carrier such as glass or plastic, and may for example have an area of several $cm^2$ or more.

Generally, an OLED device must be mounted or assembled with additional elements, for example it may need to be mounted into part of a luminaire. During an assembly process or during a quality check, even when preventive measures are taken, there is considerable risk of contact between the OLED device and an electrostatically charged part. The ensuing electrostatic discharge (ESD) through the OLED can result in catastrophic device failure, i.e. the OLED is damaged to the extent that it cannot function any longer.

A common way of dealing with this problem is to connect a negative overvoltage protection diode such as a transient voltage suppression diode to the OLED in the device package to provide protection against such a negative overvoltage. In the following, the "negative overvoltage protection diode" may simply be referred to as an "overvoltage protection diode", and it may be assumed that such an overvoltage protection diode serves to protect against an undesirable negative overvoltage. Generally, an overvoltage protection diode such as a surface-mount component is electrically connected to the printed circuit board that also carries the OLED device, and can be mounted near the electronic driver and controller of the OLED device. However, this approach suffers from various drawbacks, for example the added costs of an additional discrete component and the costs of the additional process steps. Furthermore, having to include another discrete component also increases the overall package size. However, a potentially more serious drawback of this approach is that the OLED device will not be protected from overvoltage or ESD events until such time as the discrete overvoltage protection diode is electrically connected in a circuit with the OLED device. The need to provide ESD protection to the OLED device as early as possible can make the end-of-line process significantly more complicated and expensive.

Therefore, it is an object of the invention to overcome the problems outlined above to provide a way of reliably protecting an OLED device from overvoltage damage during any manufacturing stage.

SUMMARY OF THE INVENTION

The object of the invention is achieved by the method of claim 1 of manufacturing an OLED device, and by the OLED device of claim 10.

According to the invention, the method of manufacturing an OLED device comprising an OLED and an integrated negative overvoltage protection diode comprises at least the steps of: depositing a first OLED electrode and a separate second OLED electrode contact on a carrier, which second OLED electrode contact incorporates a first overvoltage protection diode electrode; depositing an organic material layer stack to define an active region of the OLED and an active region of the overvoltage protection diode; depositing a second OLED electrode to extend over the active region of the OLED and the second OLED electrode contact; and depositing a second overvoltage protection diode electrode to extend over the active region of the overvoltage protection diode and the first OLED electrode.

The invention is based on the insight that the organic material layer stack of an OLED is a poor lateral conductor, i.e. only a negligible current will flow in a direction parallel to the layer plane. Instead, the direction of current flow is essentially entirely perpendicular to the layer plane, i.e. from anode to cathode. In the inventive method, the organic material layer stack is deposited as a single layer and therefore simultaneously defines the active region of the OLED as well as the active region of the overvoltage protection diode. Instead of treating the overvoltage protection diode as a separate entity that needs to be connected to the OLED, the inventive method takes advantage of that unidirectional current flow property, and forms the overvoltage protection diode and OLED together, thus reducing the number of patterning steps and process steps.

An advantage of the inventive method is that an overvoltage protection diode is integrated during the OLED manufacturing process directly in the OLED device itself, and is therefore available from the outset to provide the OLED with negative overvoltage protection from ESD events. In other words, from the moment the OLED is complete, it is already provided with negative overvoltage protection. The inventive method can therefore favourably reduce the costs arising from ESD-damaged components, and can also reduce the cost associated with having to provide dedicated ESD protective equipment. Furthermore, the inclusion of the overvoltage protection diode only involves slight adaptations of process steps that are required in any case for the manufacture of the OLED, and there are no additional process steps required after completion of the OLED. Specifically, the method avoids the costs associated with the use of a discrete overvoltage protection diode that must be connected to the OLED in the prior art approach.

For a semiconductor diode, the failure mode from overvoltage in the reverse or negative direction is generally catastrophic when a negative voltage exceeds the breakdown voltage of the diode. The root cause of negative overvoltage failure may be the result of various factors such as excessive leakage currents, polarisation of defects, migration, etc. that create a conductive path in the diode's reverse direction. The principle of the invention is based on the insight that the failure mode from overvoltage in the forward (or positive) direction is different, and arises from joule heating of the device. However, in order to cause damage to the diode, a positive overvoltage must be significantly greater than the negative overvoltage that would cause damage in the reverse direction. The inventors have recognised that a voltage that is damaging when it appears as a negative overvoltage may be non-damaging when it appears as a positive voltage—i.e. a relatively large positive current can flow through a diode without risk of it overheating—and have arrived at the idea of dedicating a small portion of the OLED device to reverse overvoltage protection by "flipping" the bias direction, i.e. by connecting that portion of the device—the overvoltage protection diode—in reverse. The reserved overvoltage protection diode portion is made of the same organic stack as the OLED, and can be structurally identical to the OLED, but its electrodes are connected in the opposite direction, i.e. in anti-parallel to the OLED. An overvoltage that would otherwise have to pass through an unprotected OLED will now "prefer" the path through the OPD, since an electric current will always take the path of least resistance. An overvoltage that would be seen by the OLED as a negative or reverse overvoltage is now instead seen by the overvoltage protection diode (or "OPD" in the following) as a positive forward voltage, and can be diverted through that overvoltage protection diode without damage from joule heating. As a result, the integrated overvoltage protection diode acts as a safe current channel during an ESD event or during any overvoltage event and reliably protects the OLED from damage.

A further advantage of the inventive method is that the integrated OPD can extend the lifetime of an OLED that is driven using pulse-width modulation (PWM). It has been observed that PWM driving may reduce OLED lifetime compared to analog continuous driving. In PWM operation, spikes may be present on the voltage supply line. The spikes may be present in the forward voltage direction or in the reverse voltage direction. The risk of catastrophic failure from spikes in the forward direction is low, but catastrophic failure will very likely result from spikes in the reverse or negative direction. By providing an integrated negative overvoltage protection diode during OLED manufacture, the "mortality rate" of a PWM-operated OLED series can be significantly improved.

According to the invention, the OLED device comprises an OLED and an integrated negative overvoltage protection diode and is manufactured using the inventive method, so that the OLED device comprises a first OLED electrode and a separate second OLED electrode contact on a carrier, which second OLED electrode contact incorporates a first overvoltage protection diode electrode; an organic material layer stack applied to define an active region of the OLED and an active region of the overvoltage protection diode; a second OLED electrode extending over the active region of the OLED and the second OLED electrode contact; and a second overvoltage protection diode electrode extending over the active region of the overvoltage protection diode and the first OLED electrode.

Advantageously, the inventive OLED device includes a negative OPD from the outset i.e. from the instant at which the layer structure is capable of carrying a current. For this reason, the manufacturing costs associated with the inventive OLED device are considerably lower than for a prior art OLED device, for which additional process steps are required to connect a discrete overvoltage protection diode and for which costs arising from ESD-related device failure are also a significant factor.

The dependent claims and the following description disclose particularly advantageous embodiments and features of the invention. Features of the embodiments may be combined as appropriate. Features described in the context of one claim category can apply equally to another claim category.

For the sake of simplicity, as indicated above, the integrated overvoltage protection diode serves to provide protection against a negative overvoltage, and may be abbreviated to "OPD" in the following so that the terms "overvoltage protection diode", "negative overvoltage protection diode" and "OPD" are to be understood to have the same meaning and may be used interchangeably. The term "overvoltage" may be assumed to be an excessively large negative or reverse voltage, unless otherwise indicated.

In the field of semiconductor manufacture, the terms "depositing" and "patterning" are synonyms and may therefore be used interchangeably in the following. In the inventive OLED device, the various layers are preferably patterned so that the polarity of the second OLED electrode is opposite to the polarity of the first OPD electrode. In this way, the OPD electrode can easily be connected in anti-parallel to the OLED. In a particularly preferred embodiment of the invention, the first OLED electrode is the OLED anode and the first OPD electrode is the OPD cathode. Without restricting the invention in any way, this configuration may be assumed in the following. The second OLED electrode (applied in the final stage over the organic layer stack) may therefore be understood to be the OLED cathode, and the second OPD electrode may be understood to be the OPD anode. The second OLED electrode contact is to be understood as the layer of conductive material deposited on the carrier that will later be used to electrically connect to the OLED cathode (which will be deposited on top of the active layer). The second OLED electrode contact may therefore also be referred to in the following as the OLED cathode contact. In the inventive method, the OLED cathode contact is patterned to also include a region that will act as the OPD anode. As will be explained later, the OLED cathode and OPD cathode will be deposited on top of the active layer, and the OPD cathode will be electrically connected to the OLED anode. Preferably, the layer is patterned to form a "bridge" between the opposite polarity electrodes of the OLED and the overvoltage protection diode. In this way, the desired anti-parallel connection is achieved between the OLED and the overvoltage protection diode, while at the same time integrating the overvoltage protection diode into the OLED device.

Preferably, at least the OLED anode is patterned to comprise a layer of a transparent conductive oxide. The OLED anode may be directly over the light emitting surface of the OLED device, for example an OLED lighting panel. Preferably, the OLED cathode contact is also patterned as a layer of a transparent conductive oxide. The OLED anode and OLED cathode contact can be patterned in a single process step.

In one embodiment of the invention, the OLED cathode contact comprises a plain rectangular shape, and the overvoltage protection diode is arranged within that rectangular shape. In such an embodiment, the overvoltage protection diode will be physically offset from the light-emitting area of the OLED, and may be concealed underneath a frame or housing of the OLED device. Alternatively, when the overvoltage protection area is arranged outside the OLED lighting area, the overvoltage protection diode could be covered or hidden by an opaque layer deposited in a later step, for example a thin film encapsulation layer applied to hermetically seal the OLED.

Alternatively, the OLED anode and the OLED cathode contact are patterned such that the region which will later be the overvoltage protection diode cathode extends into the region defined by the OLED anode. In this embodiment, the OLED cathode contact is extended, for example at a right angle, to form an additional small region which will be used as an electrode for the integrated OPD. In this case, the integrated overvoltage protection diode will effectively "steal" a small portion of the light-emitting area of the OLED device, and may result in a (very small and possibly indiscernible) black dot when the OLED device is emitting light. This method of manufacture can be more straightforward than the "offset" method mentioned above, which may involve more complicated patterning steps to locate the overvoltage protection diode to the side of the OLED, and may be preferred when a device with rectangular form is needed.

In one embodiment of the inventive method, the step of depositing the organic material layer stack is preceded by a step of depositing an insulating material layer to electrically isolate the OLED anode from the OLED cathode contact. This layer of insulating material is patterned to achieve a reliable protection against short circuits between the OLED electrodes. Since the separate OLED cathode contact has been patterned to incorporate the overvoltage protection diode anode, the insulating material layer is patterned to leave two distinct exposed regions on the OLED cathode contact.

Alternatively, the organic material layer stack may preferably be deposited directly over the OLED anode and OLED cathode contact, i.e. without first depositing such an insulating material layer. In this alternative approach, the lateral conductivity of the organic material layer stack is assumed to be negligible, so that the organic material layer stack itself acts as an insulator in the sideways direction, i.e. in the direction parallel to the anode plane.

In a particularly preferred embodiment of the invention, the organic material layer stack is then deposited or patterned to extend over the OLED anode and OPD cathode regions, so that effectively the OLED and the overvoltage protection diode have the same organic material layer stack composition. Alternatively, to achieve different diode characteristics, it would be possible to apply the usual organic material layer stack to extend over the OLED anode region, and to apply a different layer stack over the OPD cathode region. The additional expense of any additional process steps may be justified depending on the application in which that OLED device is to be used.

In a final process step, the OLED cathode is patterned on top of the organic material layer stack, along with the OPD cathode. These electrodes can be deposited in a single process step as a single region, and then electrically separated from each other. To this end, one embodiment of the inventive method may preferably comprise a step of depositing a single area to include both regions, and then forming the OLED cathode and the OPD cathode regions using a suitable laser ablation technique.

Alternatively, the OLED cathode and OPD cathode can be patterned separately. To this end, an alternative embodiment of the inventive method may preferably comprise a step of patterning the OLED cathode and the OPD cathode using a shadow mask during thermal evaporation, preferably leaving a gap of at least 100 µm, more preferably at least 400 µm between these regions. The slight gap permits a robust shadow mask for the evaporation step, thereby preventing underevapoation.

The current-carrying capacity of the integrated overvoltage protection diode will depend to a large extent on the overvoltage protection diode area, since current is proportional to the active area in the case of a semiconductor diode. Preferably, the dimensions of the integrated overvoltage protection diode are chosen to ensure overvoltage protection in a suitable range. The desired range may depend to some extent on the ESD protection level desired for the OLED (coupling capacity, discharge resistor, estimated number of expected ESD events, etc.).

As mentioned above, the idea behind the invention is that during an overvoltage event, a peak current can flow inside the integrated overvoltage protection diode in the positive direction without any risk of heat damage to the overvoltage protection diode.

The temperature developing in a diode depends on how energy is distributed over the active area i.e. the current density of the diode, usually expressed in amps per unit area of cross section. Of course, the current density of an OLED will depend to a large extent also on the composition of the organic layer stack. In a preferred embodiment of the invention, the current density in the overvoltage protection diode area should be as low as possible, so that the overvoltage protection diode will not overheat when it diverts an overvoltage event as a positive current. To this end, the area of the overvoltage protection diode area is preferably as large as possible. Assuming that an OLED may safely withstand a brief current pulse in the forward direction at an intensity that is significantly higher than the nominal current, for example by a factor of n, the acceptable current density in the overvoltage protection diode area would correspond to that factor, and the area of the overvoltage protection diode can cover a correspond small fraction of the OLED area. Similarly, for an OLED that can safely withstand such a current pulse at an intensity that is forty times higher than the nominal current, the area of the overvoltage protection diode could be one fortieth of the OLED area.

In a preferred embodiment of the invention, the total active area required by the integrated overvoltage protection diode is preferably at most one twentieth, more preferably at most one thirtieth, and most preferably at most one fortieth of the total active area of the OLED. For example, if the active area or lighting area of the OLED is 10 cm$^2$, the area of the integrated overvoltage protection diode at most 0.25 cm$^2$, preferably at most 0.33 cm$^2$ and most preferably at most 0.5 cm$^2$.

The inventive OLED device can be realised as an OLED panel with a single lighting area. Alternatively, in a preferred embodiment of the invention, the inventive OLED device can be realised as an OLED panel comprising several large lighting areas connected in parallel. This configuration can be preferred since it is possible to independently switch different lighting areas on and off to obtain a dynamic effect. In such an embodiment, since the lighting areas are connected in parallel, it may be sufficient to incorporate the OPD in just one of the OLED panel areas.

The concept of dedicating a certain region of the OLED device to overvoltage protection can be extended to realise a further function. In a preferred embodiment of the invention, the OLED device is realised as a bi-colour device in which one part of the OLED is realised to emit light in a first colour, and the anti-parallel connected part of the OLED is realised to emit light in a second colour. For example, the OLED device may comprise a stack that emits red light, and an amber-emitting semi-transparent stack applied over the red-emitting stack, connected in anti-parallel to the red stack. The OLED device may be used in an automotive rear lighting application with combined tail-light and turn-light (indicator) functionality. The anti-parallel connected amber or yellow stack of this OLED device therefore fulfils two functions—not just as an overvoltage protection diode, but also as a part of the lighting device itself. This favourable embodiment saves a wire connection, since only two wires are needed instead of three, while at the same time providing ESD/pulse protection from the earliest manufacturing stage. A driver for this OLED rear lighting application is preferably capable of reversing the drive current as required in order to obtain red light or yellow light as appropriate. The skilled person will know which transparent or semi-transparent materials are appropriate for the electrodes.

In a prior art approach to manufacturing bi-colour OLED panels, organic stacks for the first-colour areas are alternated with organic stacks for the second-colour areas, so that these different stack compositions are applied side-by-side on the anode layer. Separate cathode contacts must then be deposited on the different stacks and connected as appropriate so that the OLEDs of the first colour can be turned on and off independently of the OLEDs of the second colour. Manufacture of such a bi-colour OLED panel is therefore complex. Furthermore, such a bi-colour device can be regarded as two parallel-connected diodes (one "red" and one "yellow" diode, for example), and requires overvoltage protection for each "diode" of the device, with the attendant drawbacks described in the introduction.

Other objects and features of the present invention will become apparent from the following detailed descriptions considered in conjunction with the accompanying drawings. It is to be understood, however, that the drawings are designed solely for the purposes of illustration and not as a definition of the limits of the invention.

BRIEF DESCRIPTION OF THE DRAWINGS

In the drawings, like numbers refer to like objects throughout. Objects in the diagrams are not necessarily drawn to scale.

DETAILED DESCRIPTION OF THE EMBODIMENTS

Figure 1:
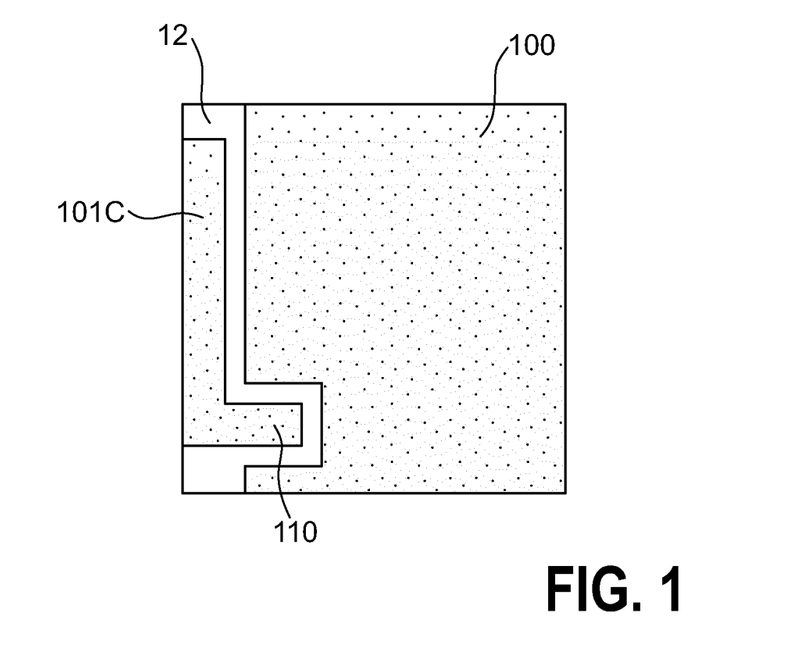
FIGS. 1-4 show steps of a first embodiment of the inventive method.

FIGS. 1-4 show steps of a first embodiment of the inventive method, and show a plan view in the direction of the future rear surface of the OLED. FIG. 1 shows the patterning of a substrate 12 or carrier 12 to form an OLED anode 100 and an OLED cathode contact 101C. A suitable choice of material is a transparent conductive oxide (TCO) applied in a thin layer. The substrate 12 may be glass or other transparent material. In a prior art manufacturing method, the OLED anode would generally have a simple rectangular or square shape, and the OLED cathode contact would be patterned as a narrow rectangle running alongside one edge of the OLED anode. At this initial stage in the inventive manufacturing process, however, a small portion 110 of the cathode contact 101C is prepared for the anode of an integrated negative overvoltage protection diode. In this exemplary embodiment, this anode portion 110 of the overvoltage protection diode is patterned to extend "into" the OLED anode 100.

Figure 2:
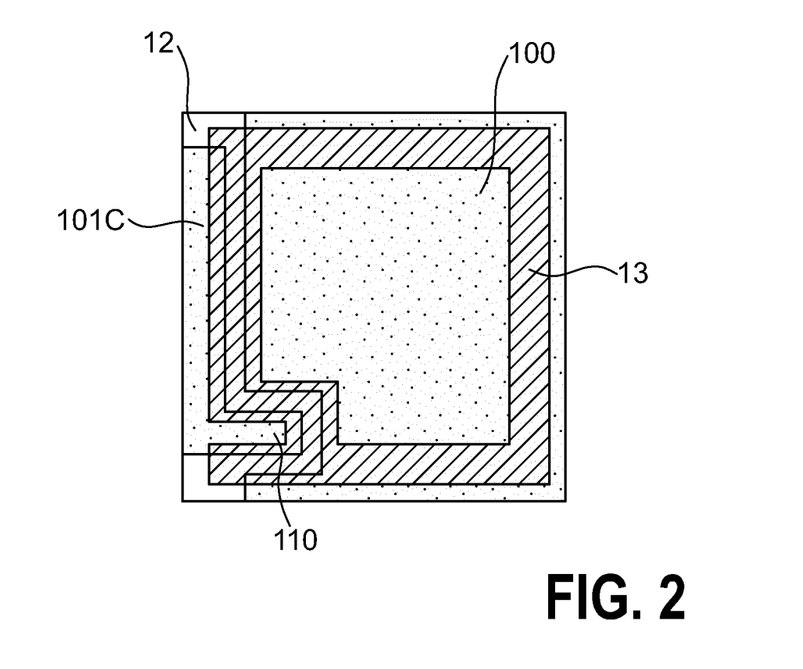

FIG. 2 shows the application of an insulating material 13 between the OLED anode 100 and the OLED cathode contact 101C. The insulating border 13 serves primarily to electrically separate the OLED anode 100 from the OLED cathode contact 101C. In the inventive manufacturing method, the insulating border 13 also isolates the OPD anode 110 from the OLED anode 100.

Figure 3:
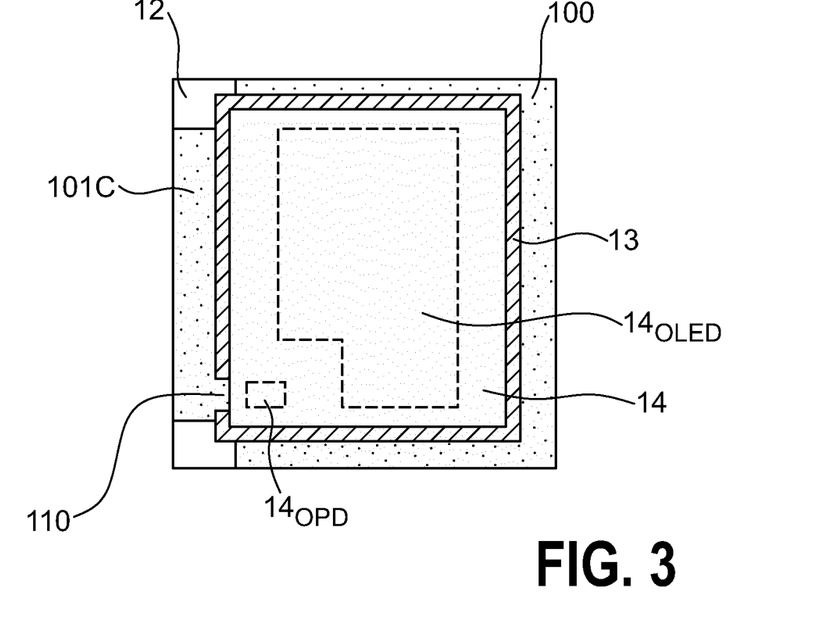

FIG. 3 shows the deposition of an organic material layer stack 14. Here, the organic material layer stack 14 has a simple rectangular shape. For the most part, the layer stack 14 extends onto the insulant layer 13 in such a way as to be contained within the insulant layer 13. In a prior art manufacturing method, the layer stack would be entirely contained within the insulant layer. However, in the inventive method, a small portion of the organic material layer stack 14 makes direct contact with the OPD anode 110. This portion of the organic material layer stack 14 indicated within the small rectangle will be the active region $14_{OPD}$ of the integrated OPD. The portion of the organic material layer stack 14 indicated within the larger boundary will be the active region $14_{OLED}$ of the OLED. Here, the relative sizes of the active regions $14_{OPD}$, $14_{OLED}$ are chosen for the purposes of illustration. In fact, the size of the active region $14_{OPD}$ of the integrated OPD may only be a very small fraction of the size of the active region $14_{OLED}$ of the OLED, so that a "black dot" caused by the OPD within the light-emitting area of the OLED will hardly be perceptible to the naked eye.

Figure 4:
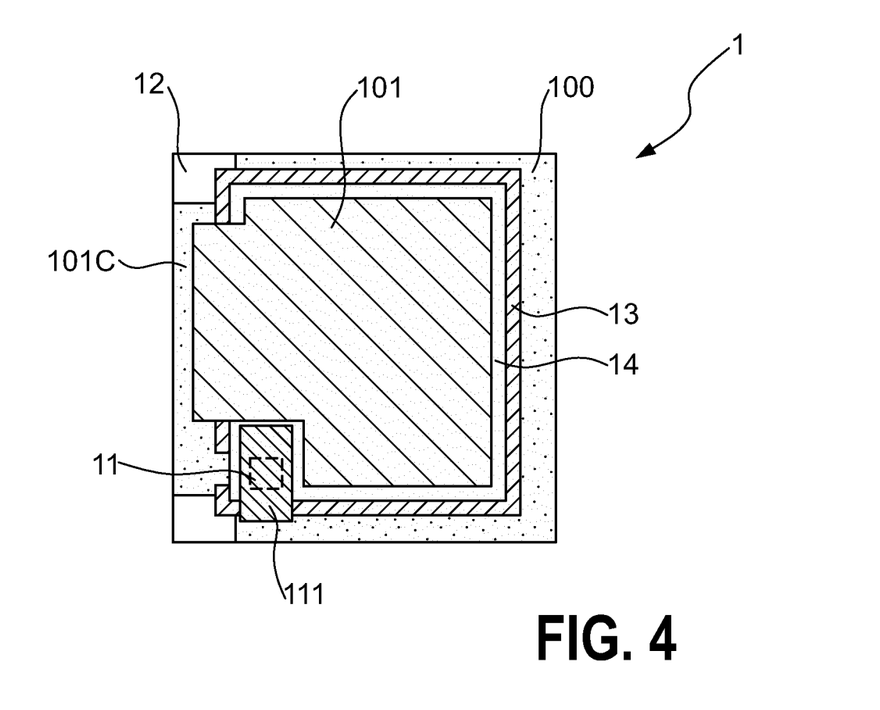

The step described in FIG. 2 is not mandatory, and in an alternative embodiment of the inventive method, the step described in FIG. 1 can be followed directly by the step of depositing the organic material layer stack 14 over the OLED anode 100, the OLED cathode contact 101C, and the intermediate strip of substrate 12 or carrier 12. FIG. 4 shows the deposition of the cathode electrode 101 on top of the organic material layer stack 14, extending onto the exposed region of the OLED cathode contact 101C. In a prior art manufacturing method, the cathode would be patterned to extend over most of the organic material layer stack and most of the cathode contact. This is also the case for the inventive method, however the same layer is patterned to also extend over the organic material layer stack portion of the integrated OPD 11 to form the OPD cathode 111. A narrow gap is left between the OPD cathode 111 and the OLED cathode 101, so that the OLED cathode 101 is electrically separated from the OPD cathode 111.

Figure 5:
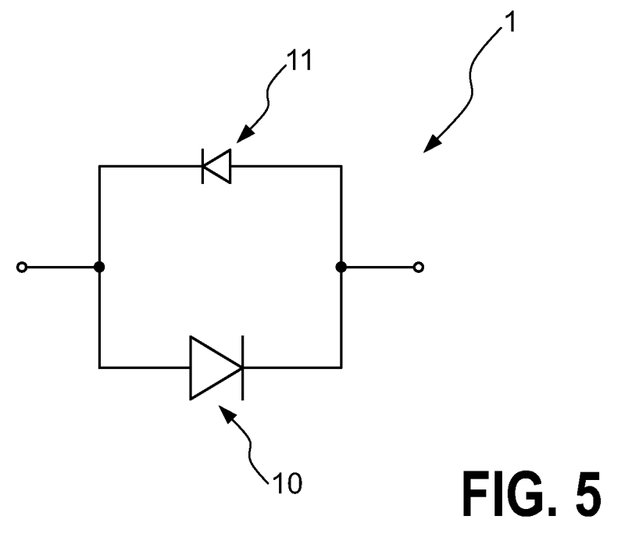
FIG. 5 shows a simplified circuit diagram of the inventive OLED device.
Figure 6:
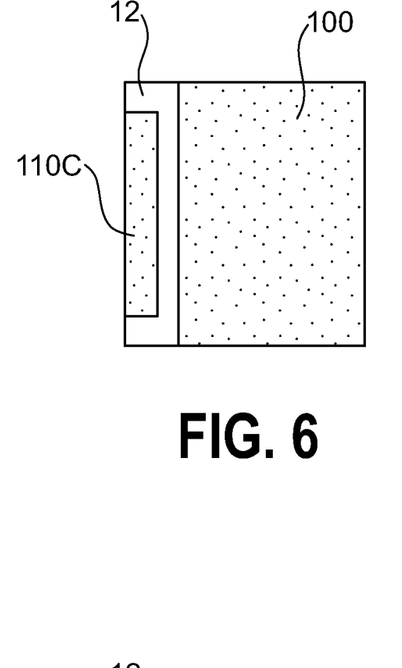
FIGS. 6-9 show steps of a second embodiment of the inventive method.
Figure 7:
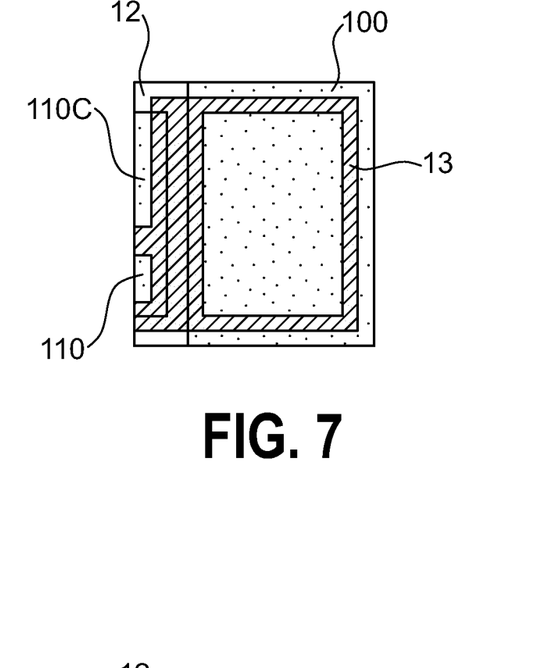
Figures 8, 9:
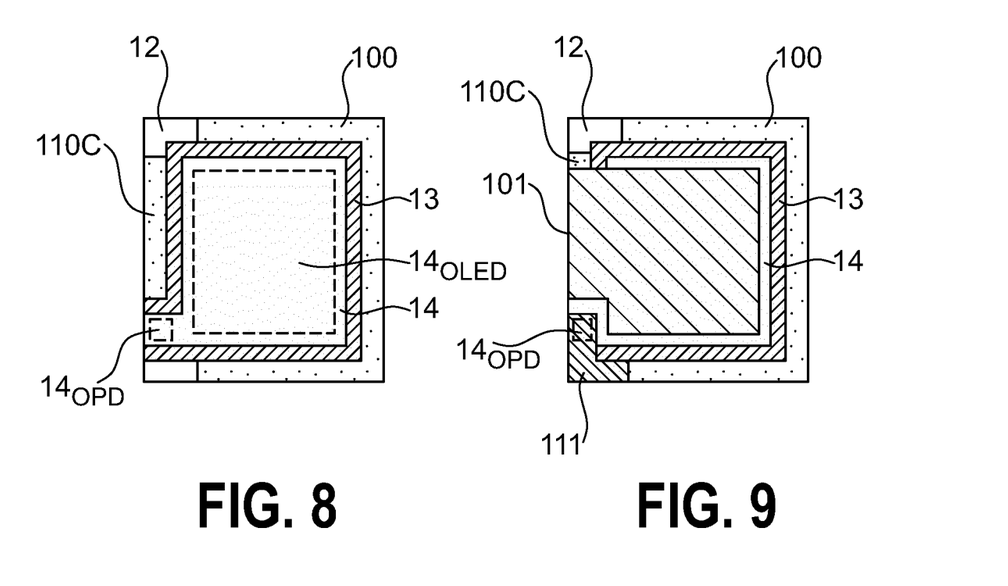

Already at this stage of the inventive manufacturing process, the anode 110 of the integrated OPD 11 is electrically connected to the OLED cathode 101 through the OLED cathode contact 101C, while the OPD cathode 111 is electrically connected to the OLED anode 100, so that the OLED and the overvoltage protection diode 11 are effectively already connected in anti-parallel. As a result, an overvoltage protection diode is incorporated in the OLED during the OLED manufacturing stage, and overvoltage protection is therefore available to the OLED from this early manufacturing stage, even before the OLED is connected in an electrical circuit. The anti-parallel connection of the OLED 10 and the OPD 11 is shown in the simplified electric circuit diagram of the inventive OLED device 1 shown in FIG. 5. Overvoltage protection is provided from the outset for any ESD events or voltage spikes in the "reverse" polarity direction, i.e. in the direction opposite to current flow during normal operation of the OLED.

FIGS. 6-9 show an alternative way of building the OLED and overvoltage protection diode layers. Generally, the same sequence of steps as explained in FIGS. 1-4 applies here also, but instead of patterning the OLED cathode contact to extend into the OLED anode region, the OLED cathode contact 101C is patterned as a plain rectangular shape, and the OPD 11 is built over a region of that rectangle. The OLED light emitting area can also have a plain rectangular shape. Since the OPD 11 is effectively located to the side of the OLED light emitting area, there will be no "black dot" within the light-emitting area.

Figure 10:
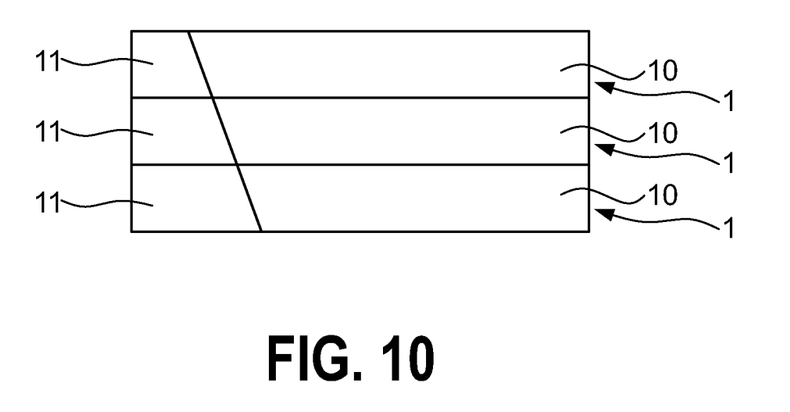
FIG. 10 shows an exemplary application using an embodiment of the inventive OLED device.

FIG. 10 shows an exemplary application that uses the inventive OLED device. Here, a left-hand-side rear lighting unit of an automobile comprises three instances of the inventive OLED device 1. In each instance, the active area of the OLED 10 is realised to emit red light, and the active area of the OPD 11 (applied as a semi-transparent stack over the red-emitting stack) is realised to emit yellow or amber light. Therefore, when the device driver applies the usual "forward direction" drive voltage to the OLED devices 1, the OLEDs 10 emit red light, but when the device driver applies a "reverse" drive voltage to the OLED devices 1, the OPD regions 11 emit yellow light. In such an embodiment, the OPD regions 11 not only serve to protect the OLED regions 10 from reverse overvoltages from the early stages of manufacture and throughout the lifetime of the device, but are also used as a functional part of the lighting unit itself.

Figure 11:
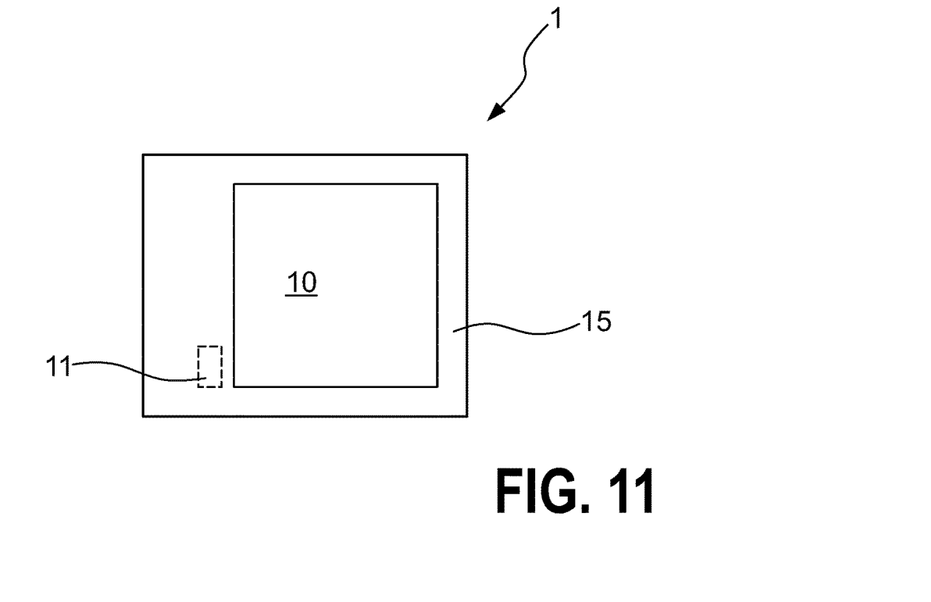
FIG. 11 shows a plan view of an embodiment of the inventive OLED device.

FIG. 11 shows a plan view of another embodiment of the inventive OLED device 1. Here, the OLED 10 is enclosed in a housing 15. The various layers of the OLED 10 and the integrated overvoltage protection diode 11 have been patterned so that the overvoltage protection diode 11 is to the side of the light-emitting area of the OLED (for example as explained in FIGS. 6-9 above) and is concealed underneath the housing 15. In this way, a "black dot" resulting from the presence of the OPD 11 will not be noticeable in the light-emitting area of the OLED 10.

Figure 12:
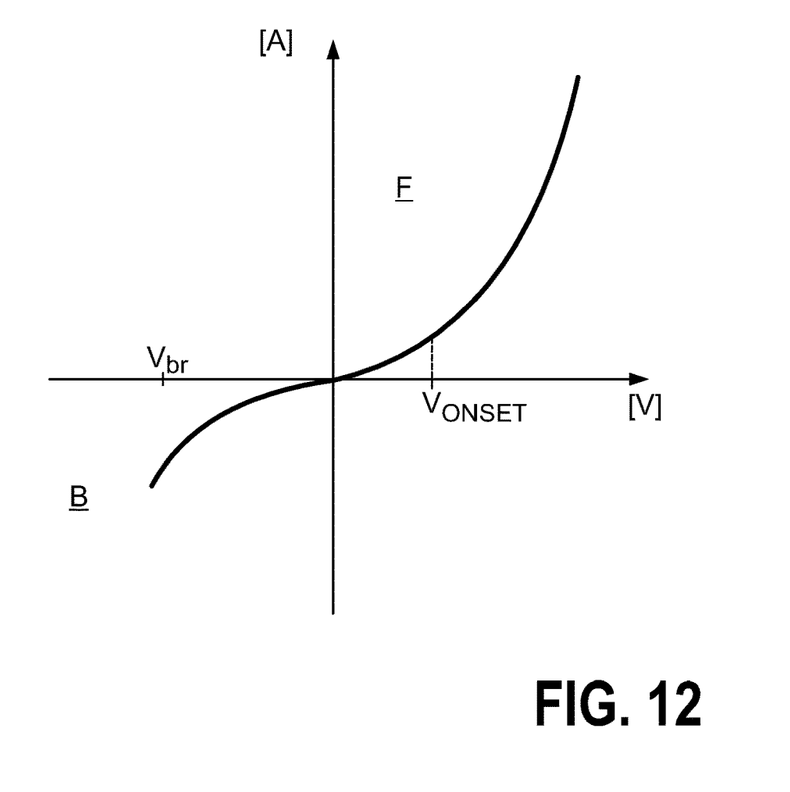
FIG. 12 shows a diode I-V curve.

FIG. 12 shows an exemplary OLED I-V curve. With increasing area, the curve becomes steeper, rising more rapidly, and the onset voltage $V_{onset}$ (the voltage at which the OLED starts to emit light) decreases accordingly. Since the integrated overvoltage protection diode and the OLED have the same structural composition, the same I-V curve applies to both OPD and OLED for the inventive OLED device. When the inventive OLED device is incorporated in an application and is operational, the forward voltage range F applies and the OLED emits light. The reverse breakdown voltage $V_{br}$ of an OLED is not directly related to its cross-sectional area. Instead, as explained above, it depends on various factors such as organic stack composition, doping ratio, organic stack material, thickness of organic layers, etc. Since the integrated OPD and the OLED are made in the same process and using the same materials, they will essentially have the same breakdown voltage in the reverse direction. In the manufacturing and handling stages before the OLED device is connected in its intended application, the integrated OPD offers protection during "negative" ESD events, i.e. ESD events that would result in a reverse voltage applied to the OLED, but which are instead safely diverted in the forward direction through the OPD. By appropriating a relatively small part of the OLED device and connecting it in anti-parallel to the actual OLED, this integrated OPD can absorb the energy and conduct the current the forward direction without risk of failure from joule heating, while at the same time protecting the actual OLED from catastrophic reverse voltage damage.

Figure 13:
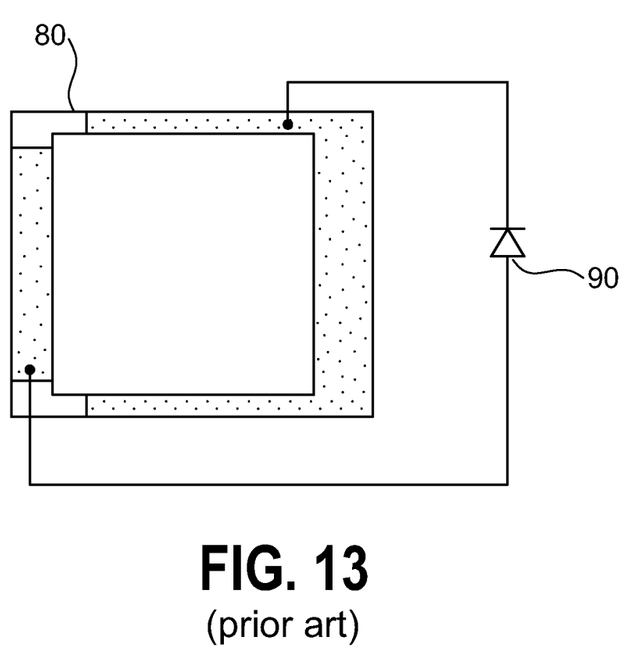
FIG. 13 shows a plan view of a prior art OLED device with a discrete overvoltage protection diode.

FIG. 13 shows a simplified plan view of a prior art OLED device 80 with a transient voltage suppression diode 90 for overvoltage protection. The overvoltage protection diode 90 is a discrete component that must be electrically connected in anti-parallel to the OLED device 80 after manufacture of the OLED device 80. However, as explained above, the OLED device 80 is essentially unprotected from ESD damage until such time as the overvoltage protection diode 90 is actually connected.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

REFERENCE SIGNS

OLED device 1
OLED 10
TVS diode 11
first TVS diode electrode 110
first OLED electrode 100
second OLED electrode 101
second OLED electrode contact 101C
carrier 12
insulating material layer 13
organic material layer stack 14
OLED active region $14_{OLED}$
TVS diode active region $14_{TVS}$
prior art OLED device 80
discrete TVS diode 90
breakdown voltage $V_{br}$
onset voltage $V_{onset}$

The invention claimed is:

1. A method of manufacturing an OLED device comprising an OLED and an integrated negative overvoltage protection diode, which method comprises at least the steps of:
    depositing a first OLED electrode and a separate second OLED electrode contact on a carrier, which second OLED electrode contact incorporates a first overvoltage protection diode electrode;
    depositing an organic material layer stack as a single layer stack to simultaneously define an active region of the OLED and an active region of the overvoltage protection diode;
    depositing a second OLED electrode to extend over the active region of the OLED and the second OLED electrode contact, such that the first overvoltage protection diode electrode is electrically connected to the second OLED electrode through the second OLED contact; and
    depositing a second overvoltage protection diode electrode to extend over the active region of the overvoltage protection diode and the first OLED electrode, such that the second overvoltage protection diode electrode is electrically connected to the first OLED electrode, wherein the OLED and the overvoltage protection diode are connected in anti-parallel.

2. A method according to claim 1, wherein the step of depositing the organic material layer stack is preceded by a step of depositing an insulating material layer to electrically isolate the first OLED electrode from the second OLED electrode contact.

3. A method according to claim 1, wherein the polarity of the second OLED electrode is opposite to the polarity of the first overvoltage protection diode electrode.

4. A method according to claim 1, wherein the second OLED electrode is the OLED cathode and the first overvoltage protection diode electrode is the overvoltage protection anode.

5. A method according to claim 1, wherein the second overvoltage protection diode electrode and the second OLED electrode are formed by electrically separating these regions from a uniformly applied layer.

6. A method according to claim 1, wherein the second OLED electrode contact comprises a plain rectangular shape, and wherein the overvoltage protection diode is arranged within that rectangular shape.

7. A method according to claim 1, wherein the first OLED electrode and the second OLED electrode contact are patterned such that the first overvoltage protection diode electrode extends into the region defined by the first OLED electrode.

8. A method according to claim 1, wherein the active area of the OLED is realised to emit light of a first colour, and the active area of the overvoltage protection diode is realised to emit light of a second colour.

9. An OLED device comprising an OLED and an integrated negative overvoltage protection diode, which OLED device comprises
 a first OLED electrode and a separate second OLED electrode contact on a carrier, which second OLED electrode contact incorporates a first overvoltage protection diode electrode;
 an organic material layer stack deposited as a single layer stack applied to simultaneously define an active region of the OLED and an active region of the overvoltage protection diode;
 a second OLED electrode extending over the active region of the OLED and the second OLED electrode contact, such that the first overvoltage protection diode electrode is electrically connected to the second OLED electrode through the second OLED contact; and
 a second overvoltage protection diode electrode extending over the active region of the overvoltage protection diode and the first OLED electrode (100), such that the second overvoltage protection diode electrode is electrically connected to the first OLED electrode (100),
 wherein the OLED and the overvoltage protection diode are connected in anti-parallel.

10. The OLED device according to claim 9, wherein the first OLED electrode and the second OLED electrode contact comprise a layer of a transparent conductive oxide.

11. The OLED device according to claim 9, wherein the integrated overvoltage protection diode is dimensioned to ensure protection against an overvoltage that exceeds the nominal voltage of the OLED by a factor of at least two, more preferably by a factor of at least three, most preferably by factor of at least four.

12. The OLED device according to claim 9, wherein the total area required by the integrated overvoltage protection diode is at most 5% of the OLED active are, more preferably at most 3.33% of the OLED active area, most preferably at most 2.5% of the OLED active area.

13. The OLED device according to claim 9, comprising a housing frame extending about the light-emitting area of the OLED, and wherein the overvoltage protection diode is concealed by the housing frame.

14. A lighting panel comprising the OLED device according to claim 9, wherein the OLED lighting panel comprises a plurality of independent lighting areas connected in parallel and with at least one of the OLED device in one of the independent lighting areas.

\* \* \* \* \*